(12) United States Patent
Sumida et al.

(10) Patent No.: US 8,344,370 B2
(45) Date of Patent: Jan. 1, 2013

(54) DISPLAY APPARATUS

(75) Inventors: Takayuki Sumida, Mobara (JP); Shoji Sudo, Kawasaki (JP); Naoyuki Ito, Yokohama (JP); Takayuki Ito, Mobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 41 days.

(21) Appl. No.: 13/050,656

(22) Filed: Mar. 17, 2011

(65) Prior Publication Data
US 2012/0056164 A1 Mar. 8, 2012

(30) Foreign Application Priority Data

Mar. 18, 2010 (JP) ................ 2010-062207

(51) Int. Cl.
*H01L 51/54* (2006.01)
(52) U.S. Cl. .............. 257/40; 257/89; 257/98; 257/749; 257/E51.019; 257/E51.022; 257/E33.064; 257/E33.073
(58) Field of Classification Search .............. 257/40, 257/89, 98, 749, E51.019, E51.022, E33.064, 257/E33.073
See application file for complete search history.

(56) References Cited

U.S. PATENT DOCUMENTS

| | | | |
|---|---|---|---|
| 2004/0166362 A1* | 8/2004 | Utsumi et al. | 428/690 |
| 2006/0113907 A1 | 6/2006 | Im et al. | |
| 2011/0031482 A1* | 2/2011 | Furukawa et al. | 257/40 |
| 2011/0248256 A1* | 10/2011 | Cok et al. | 257/40 |
| 2012/0007068 A1* | 1/2012 | Smith et al. | 257/40 |
| 2012/0018749 A1* | 1/2012 | Lee et al. | 257/89 |
| 2012/0138918 A1* | 6/2012 | Naraoka et al. | 257/40 |

* cited by examiner

*Primary Examiner* — George Fourson, III
(74) *Attorney, Agent, or Firm* — Canon U.S.A., Inc., IP Division

(57) ABSTRACT

In a display apparatus including pixels, each of which has organic EL elements which emit red, green, and blue (RGB) colors and a refractive index-control layer, an electrode at a light extraction side of each organic EL element is a silver layer in contact with a charge transport layer, the refractive index-control layer is arranged on the silver layer in common with the organic EL elements which emit RGB colors, and an effective refractive index ($n_{eff}$) represented by the following formula is in a range of 1.4 to 2.3.

$$n_{eff} = 0.7 \times n_u + 0.3 \times n_d$$

In the above formula, $n_u$ indicates the refractive index of the refractive index-control layer 3, and $n_d$ indicates the refractive index of the charge transport layer 1.

3 Claims, 7 Drawing Sheets

DISPLAY APPARATUS

BACKGROUND OF THE INVENTION

1. Field of the Invention

The present invention relates to a display apparatus in which organic electroluminescent (EL) elements, each of which uses a silver thin film as an electrode at a light extraction side, are arranged.

2. Description of the Related Art

An organic EL element has the structure in which an organic compound layer including a luminous layer is provided between an anode and a cathode, and at least one electrode at a light extraction side (hereinafter referred to as a "light extraction-side electrode" in some cases) is required to be transparent. As the transparent electrode, for example, an oxide transparent electrode formed, for example, of indium tin oxide (ITO) is generally used.

In addition, an attempt to use a metal thin film as the transparent electrode has been carried out in order to obtain higher transmittance and electrical conductivity. As a material for the metal thin film, for example, gold, silver, or copper, each of which has high electrical conductivity and transmittance in the visible light region, may be mentioned. Among these mentioned above, since the wavelength dependence of the transmittance is flat and the electrical conductivity is also high, silver is promising. However, even if silver is formed into a thin film, its transmittance is not simply improved. One of the reasons for this is a localized surface plasmon absorption of silver (see J. J. Mock, D. R. Smith, S. Schultz, "Local Refractive Index Dependence of Plasmon Resonance Spectra from Individual Nanoparticles", Nano Letters, 2003, Vol. 3, No. 4, pp. 485-491).

In general, when the thickness of a silver thin film is decreased to approximately 10 nm in order to improve the transmittance, this thin film is placed into a discontinuous island state instead of forming a continuous and uniform film. Since silver particles in the form of islands have the localized surface plasmon absorption in the visible light region, the transmittance of the silver thin film is disadvantageously decreased.

When an underlayer composed of a metal other than silver is formed under a silver thin film to have a thickness smaller than that thereof, a continuous and uniform silver thin film is obtained instead of being placed into an island state; hence, as one of measures for the above problem, a technique has been proposed in which a transparent conductive laminate film having an excellent transmission property as compared to that of a thin film of a silver element is formed (see Japanese Patent Laid-Open No. 2008-171637).

SUMMARY OF THE INVENTION

However, when the underlayer composed of a metal is provided as disclosed in Japanese Patent Laid-Open No. 2008-171637, although the thickness of this underlayer is smaller than that of the silver thin film, there is not a little transmittance loss caused by the underlayer. In addition, since the underlayer must have a function of controlling silver film formation so as not to place a silver thin film into an island state, a metal having the above function can only be selected as a material for the underlayer.

In consideration of the above problems, aspects of the present invention provide a display apparatus in which organic EL elements are arranged, each of which uses a thin film of silver as a light extraction-side electrode and in which the transmittance of a predetermined wavelength can be improved.

A structure of the display apparatus according to aspects of the present invention is as follows.

That is, a display apparatus has pixels each of which includes an organic El element emitting red light, an organic El element emitting green light, an organic El element emitting blue light, and a refractive index-control layer. In the display apparatus described above, the organic EL elements each include an anode, a cathode, and an organic compound layer provided therebetween which includes a luminous layer and a charge transport layer; one of the anode and the cathode arranged at a light extraction side is a silver layer which contains silver, which has a thickness of less than 30 nm, and which is in contact with the charge transport layer; the refractive index-control layer is arranged on the silver layer in common with the organic El element emitting red light, the organic El element emitting green light, and the organic El element emitting blue light; and an effective refractive index ($n_{eff}$) represented by the following formula is in a range of 1.4 to 2.3.

$$n_{eff}=0.7 \times n_u + 0.3 \times n_d$$

In the above formula, $n_u$ indicates the refractive index of the refractive index-control layer, and $n_d$ indicates the refractive index of the charge transport layer.

According to aspects of the present invention, the silver layer is formed in contact with the charge transport layer, and the refractive index-control layer is further formed on the silver layer in common with the color organic EL elements. By controlling the effective refractive index using this lamination structure, the absorption peak wavelength of the localized surface plasmon absorption exhibited by island-shaped silver particles of the silver layer can be shifted. Accordingly, the superimposition between the luminescence spectrum of an organic EL element emitting a predetermined color and the localized surface plasmon absorption can be reduced, and as a result, an excellent effect of improving the transmittance of a predetermined wavelength can be obtained.

Further features of the present invention will become apparent from the following description of exemplary embodiments with reference to the attached drawings.

DESCRIPTION OF THE EMBODIMENTS

Hereinafter, although embodiments of the invention will be described in detail with reference to the drawings, the present invention is not limited to the embodiments.

Figure 1:
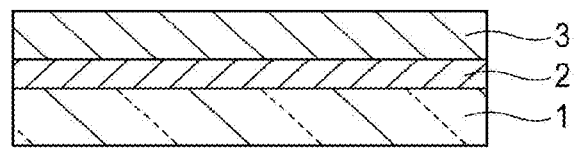
FIG. 1 is a schematic cross-sectional view of three layers at a light extraction side of an organic EL element according to aspects of the present invention.

First, with reference to FIG. 1, a lamination structure at a light extraction side of an organic electroluminescence (EL) element according to aspects of the present invention will be described. FIG. 1 is a schematic cross-sectional view of three layers at a light extraction side of the organic EL element according to aspects of the present invention. As shown in FIG. 1, the light extraction side of the organic EL element according to aspects of the present invention has the structure in which a silver layer 2 is formed in contact with a charge transport layer 1 and a refractive index-control layer 3 is further laminated on the silver layer 2.

Any material may be used for the charge transport layer 1 as long as it can withstand the conditions for film formation of the silver layer 2 containing silver.

The silver layer 2 may be a thin film containing 90 percent by weight or more of silver and is formed, for example, by a general thin film-formation method, such as a vacuum deposition method or a sputtering method. In addition, the silver layer may further contain a small amount (less than 10 percent by weight) of at least one of Pd, Cu, Mg, Au, and the like. The thickness of the silver layer 2 may be less than 30 nm, such as in a range of 5.0 to 20 nm. The reason for this is that when the thickness is 30 nm or more, although the localized surface plasmon absorption of silver particles is reduced, the reflectance of the silver layer 2 itself is increased, and the transmittance is degraded.

The refractive index-control layer 3 may be formed from any one of organic materials and inorganic materials. The particular materials will be described later.

Next, with reference to FIGS. 2 to 4, the localized surface plasmon absorption will be described when a silver thin film is used as a light extraction-side electrode. In this embodiment, a quartz glass substrate was used instead of the charge transport layer 1, a silver thin film was used as the silver layer 2, and as the refractive index-control layer 3, materials having different refractive indexes were selected, so that samples were formed.

First, after the quartz glass substrate was sequentially ultrasonic-cleaned with water, acetone, and isopropyl alcohol in this order and was then cleaned in boiled isopropyl alcohol, drying was performed. Furthermore, the quartz glass substrate thus cleaned was processed by a UV ozone treatment.

Next, the silver layer 2 was formed on the quartz glass substrate by a vacuum deposition method to have a thickness of 10 nm.

Figure 2:
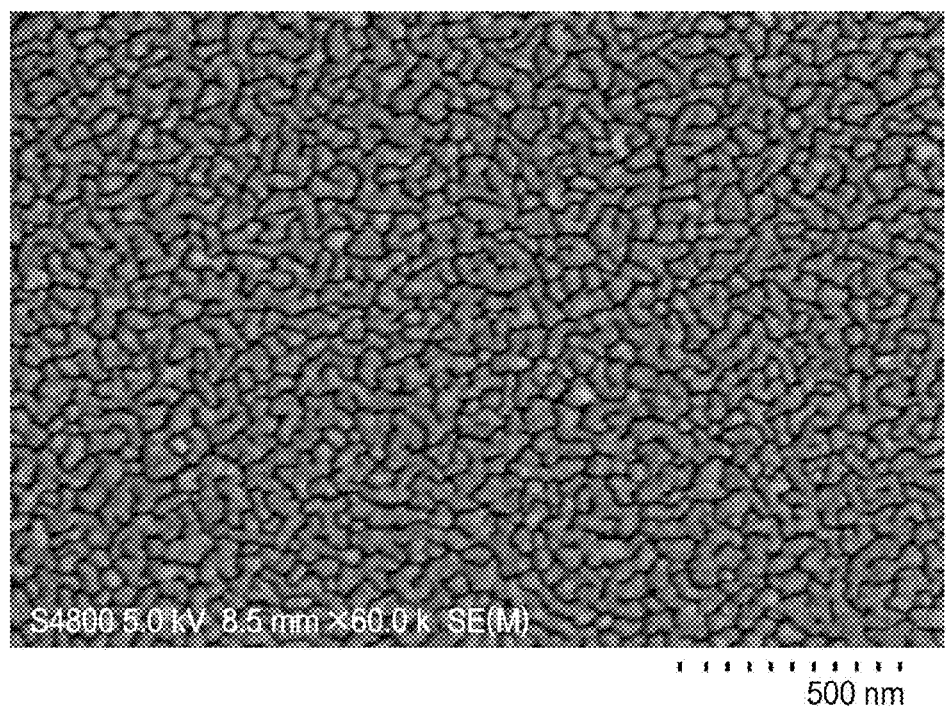
FIG. 2 is a microscope photograph showing an observation result of a quartz glass substrate/silver thin film obtained by a scanning electron microscope (SEM).

FIG. 2 is a microscope photograph showing an observation result of the quartz glass substrate/the silver thin film formed as described above by a scanning electron microscope (SEM). As shown in FIG. 2, it is observed that the silver thin film is formed of island-shaped silver particles.

Figure 3:
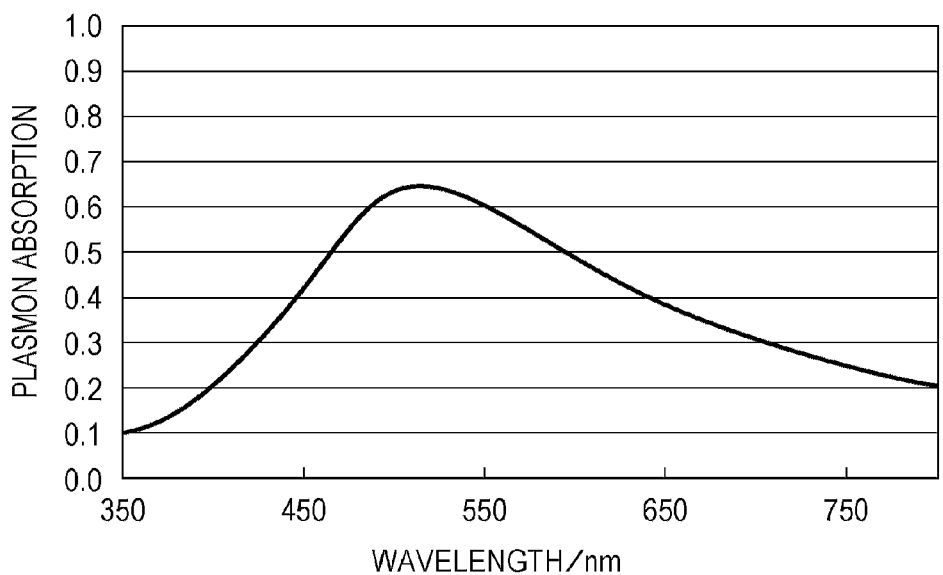
FIG. 3 is a graph showing a visible-ultraviolet light absorption spectrum of the quartz glass substrate/silver thin film.

In addition, FIG. 3 is a graph showing a visible-ultraviolet light absorption spectrum of the quartz glass substrate/the silver thin film. In this embodiment, Ubest V-560 (manufactured by JASCO Corp.) was used for the measurement of the visible-ultraviolet light absorption spectrum.

As shown in FIG. 3, in the case of air without using the refractive index-control layer 3, a localized surface plasmon absorption of the silver thin film having a peak wavelength of 515 nm can be observed. This absorption will decrease the transmittance when the silver thin film is used as a light extraction-side electrode. Hence, in order to improve the transmittance at a predetermined wavelength, it may be necessary to shift the peak wavelength.

Accordingly, in order to perform the wavelength shift of the localized surface plasmon absorption, the refractive index-control layers 3 formed of materials having various refractive indexes were each formed on the silver layer 2. When silicon dioxide (1.45), aluminum oxide (1.76), zinc oxide (1.95), indium tin oxide (2.1), and titanium oxide (2.71) were each used as the refractive index-control layer 3, the materials were each formed into a film having a thickness of 20 nm by a sputtering method. When lithium fluoride (1.39) was used, a lithium fluoride layer having a thickness of 20 nm was formed by a vacuum deposition method. The numerical value in the parentheses following each material name indicates the refractive index thereof.

Since the function of the refractive index-control layer 3 is different from that of an optical interference layer used in an organic EL element for improvement in light extraction efficiency, the thickness of the refractive index-control layer 3 is not necessary to coincide with a luminous wavelength. Furthermore, since the localized surface plasmon absorption is affected by local circumstances around silver particles, the thickness of the refractive index-control layer 3 may be small enough, such as 30 nm or less. The thickness of the refractive index-control layer 3 may be in a range of 10 to 20 nm.

Figure 4:
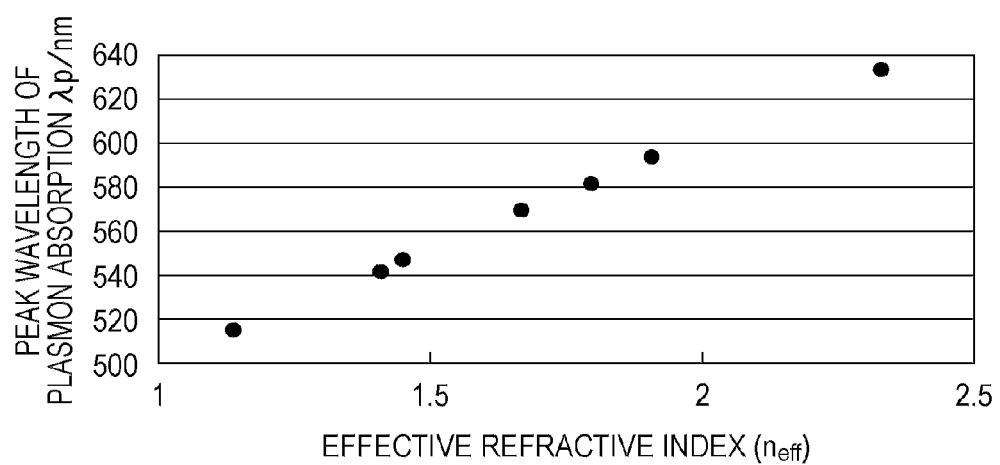
FIG. 4 is a graph showing the relationship between the peak wavelength (λp) of the localized surface plasmon absorption and an effective refractive index ($n_{eff}$).

Next, FIG. 4 is a graph showing the relationship between the peak wavelength ($\lambda$p) of the localized surface plasmon absorption and an effective refractive index ($n_{\it eff}$).

The effective refractive index ($n_{\it eff}$) is a value in consideration of the refractive index of the charge transport layer 1 (the quartz glass substrate in the above sample) and that of the refractive index-control layer 3, both of which enclose the silver layer 2 therebetween, and is represented by the following formula.

$$N_{\it eff} = \alpha \times n_u + (1-\alpha) \times n_d$$

In the above formula, $n_u$ indicates the refractive index of the refractive index-control layer 3, $n_d$ indicates the refractive index of the charge transport layer (the refractive index of the quartz glass substrate in the above sample), and $\alpha$ indicates a weight factor.

The weight factor ($\alpha$) is a coverage of the refractive index-control layer 3 covering the lump of silver of the silver layer 2 and is 0.7 according to aspects of the present invention.

As shown in FIG. 4, the localized surface plasmon absorption of the silver thin film is shifted to a longer wavelength side as the effective refractive index is increased. Accordingly, it is found that the peak wavelength of the localized surface plasmon absorption is controllable by the refractive indexes of the peripheral layers sandwiching the silver layer 2.

Therefore, when a silver thin film is used as a light extraction-side electrode, the superimposition between the spectrum of light to be transmitted and the spectrum of the localized surface plasmon absorption may be reduced as much as possible. In other words, when the refractive index of the refractive index-control layer 3 is adjusted so that the peak wavelength of the localized surface plasmon absorption is shifted from the spectral peak wavelength of the transmitted light in a shorter wavelength-side or a longer wavelength-side direction, the effect of improving the transmittance can be obtained.

[Organic EL Element]

Next, an organic EL element according to aspects of the present invention will be described.

Compounds used in this example will be shown below.

(1)
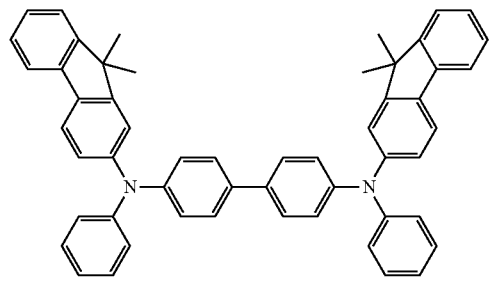

(2)
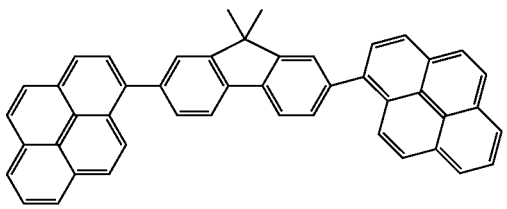

(3)
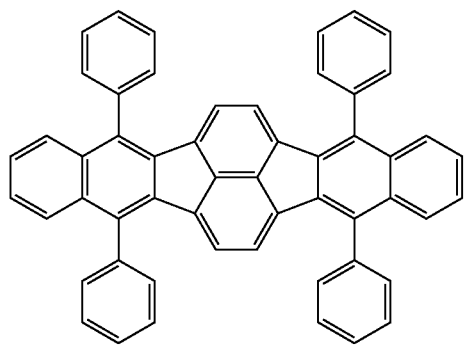

(4)
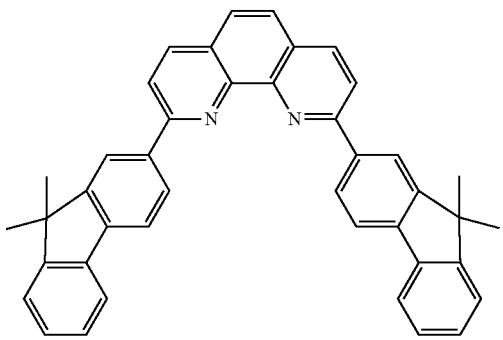

(5)
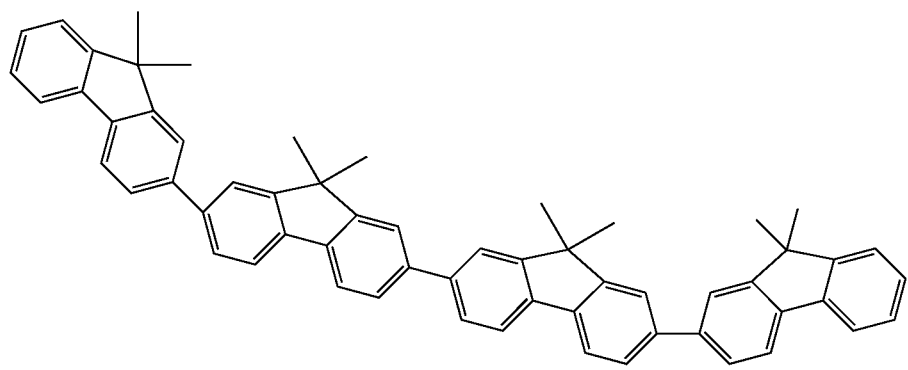

(6)
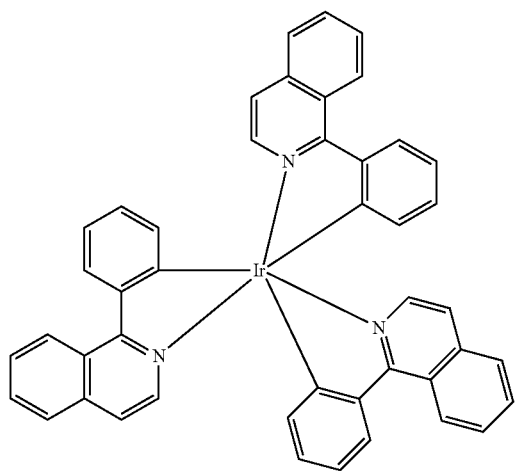

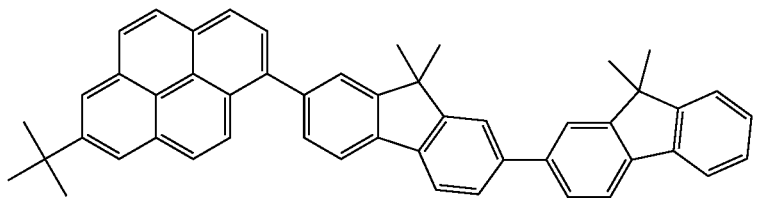

(7)

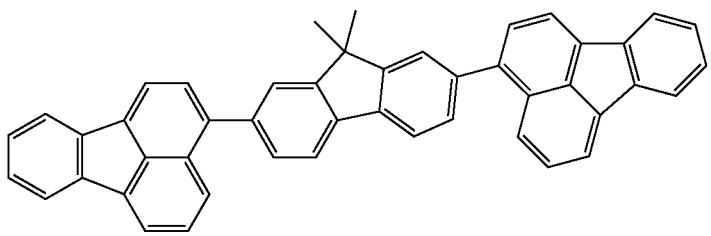

(8)

<Green Organic EL Element>

Figure 5:
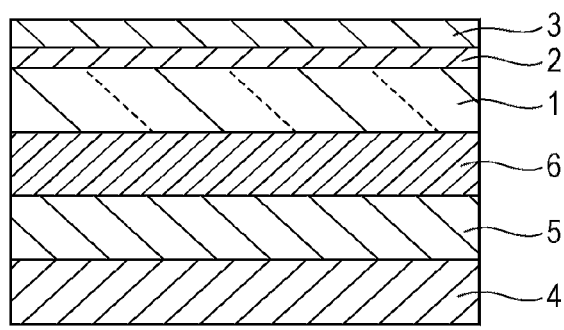
FIG. 5 is a schematic cross-sectional view showing the structure of the organic EL element according to aspects of the present invention.

First, with reference to FIG. 5, an organic EL element which emits green light according to aspects of the present invention will be described. FIG. 5 is a schematic cross-sectional view showing the structure of the organic EL element according to aspects of the present invention.

As shown in FIG. 5, the organic EL element according to aspects of the present invention has an organic compound layer including a luminous layer and a charge transport layer between an anode and a cathode, and from the bottom side, an anode (positive electrode) 4, a hole injection layer 5, a luminous layer 6, an electron transport layer 1, the silver layer 2 functioning as a cathode, and the refractive-index control layer 3 are laminated in this order. In addition, in this element structure, the upper side is a light extraction side, and the electron transport layer 1 is in contact with the silver layer 2. That is, the structure including the electron transport layer 1, the silver layer 2, and the refractive index-control layer 3 laminated in this order corresponds to the lamination structure shown in FIG. 1.

As the anode 4, a laminate prepared by depositing indium zinc oxide (IZO) to have a thickness of 38 nm on an aluminum neodymium thin film by a sputtering method was used. After this laminate was sequentially ultrasonic-cleaned with acetone and isopropyl alcohol and was then cleaned in boiled isopropyl alcohol, drying was performed. Furthermore, the transparent conductive support substrate thus cleaned was processed by an UV ozone treatment and was used in a subsequent film formation step.

A compound (1) was used for the hole injection layer 5. The hole injection layer 5 was formed from this compound (1) to have a thickness of 150 nm by a vacuum deposition method. The luminous layer 6 included a compound (2) as a primary component and a compound (3) as a luminescent dopant. These compounds received in different boats were simultaneously deposited by a vacuum deposition method, so that the luminous layer 6 was formed to have a thickness of 30 nm. The concentration of the above compound (3) was 2 percent by weight. Furthermore, a compound (4) was used for the electron transport layer 1. The electron transport layer 1 was formed from this compound to have a thickness of 40 nm by a vacuum deposition method. The degrees of vacuum for the deposition of the compounds (1) to (4) were each $5.0 \times 10^{-5}$ Pa, and the deposition rate was in a range of 0.1 to 0.3 nm/sec.

Next, silver was used as a material for the silver layer 2. On the electron transport layer 1, the silver layer 2 was formed by a vacuum deposition method to have a thickness of 10 nm.

Furthermore, silicon dioxide, aluminum oxide, zinc oxide, indium tin oxide (ITO), titanium oxide, lithium fluoride, and the above compound (4) were formed into films as the refractive index-control layer 3, so that the elements were formed. In the case of silicon dioxide, aluminum oxide, zinc oxide, indium tin oxide (ITO), and titanium oxide, films each having a thickness of 20 nm were formed therefrom by a sputtering method. In the case of lithium fluoride or the above compound (4), a film having a thickness of 20 nm was formed therefrom by a vacuum deposition method. In addition, an element including no refractive index-control layer 3 was formed as a comparative sample.

In order to prevent element degradation of the obtained organic EL element by atmospheric exposure, a protective glass tube was provided thereon in a dry nitrogen atmosphere, and sealing was performed using an acryl resin-based adhesive.

Figure 6:
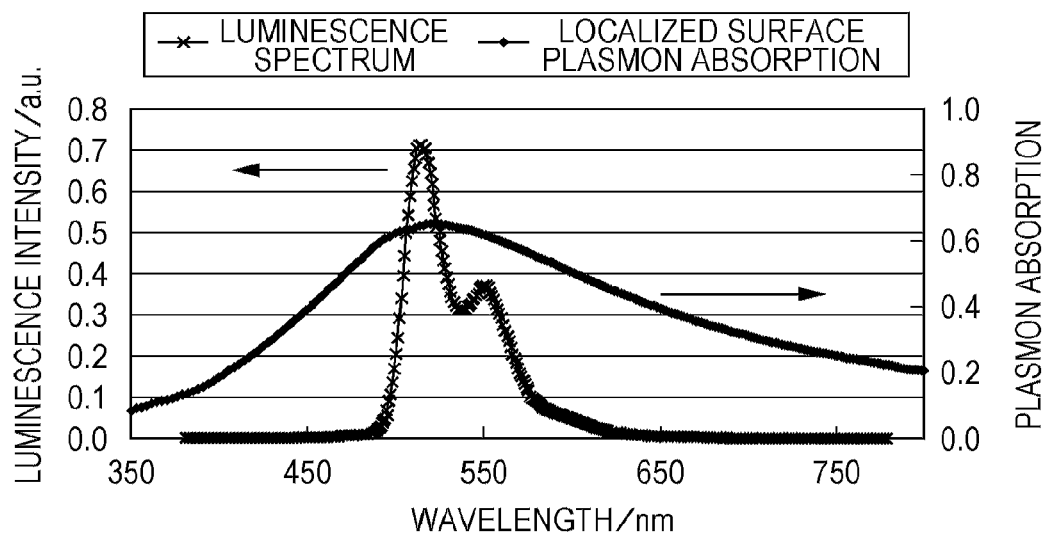
FIG. 6 is a graph showing the localized surface plasmon absorption and the luminescence spectrum from a green organic EL element including no refractive index-control layer.

FIG. 6 is a view showing the luminescence spectrum from a green organic EL element including no refractive index-control layer and the localized surface plasmon absorption. The horizontal axis indicates the wavelength, the left vertical axis indicates the EL luminescence intensity, and the right vertical axis indicates the absorbance of the localized surface plasmon absorption.

As shown in FIG. 6, when the anode was used as a positive electrode, the silver thin film was used as a negative electrode, and a direct current voltage of 10 V was applied therebetween, green luminescence derived from the above compound (3) which was a luminescent dopant was observed at a maximum luminous wavelength of 520 nm. On the other hand, the peak wavelength of the localized surface plasmon absorption was 522 nm. That is, the obtained luminescence spectrum was mostly superimposed on the localized surface plasmon absorption, and hence, the luminescence intensity was reduced by the silver thin film. Hence, the superimposition between the green luminescence spectrum and the spectrum of the localized surface plasmon absorption derived from the silver thin film may be reduced as much as possible. That is, when the localized surface plasmon absorption is shifted by the refractive index-control layer, the above superimposition can be reduced.

Figure 7:
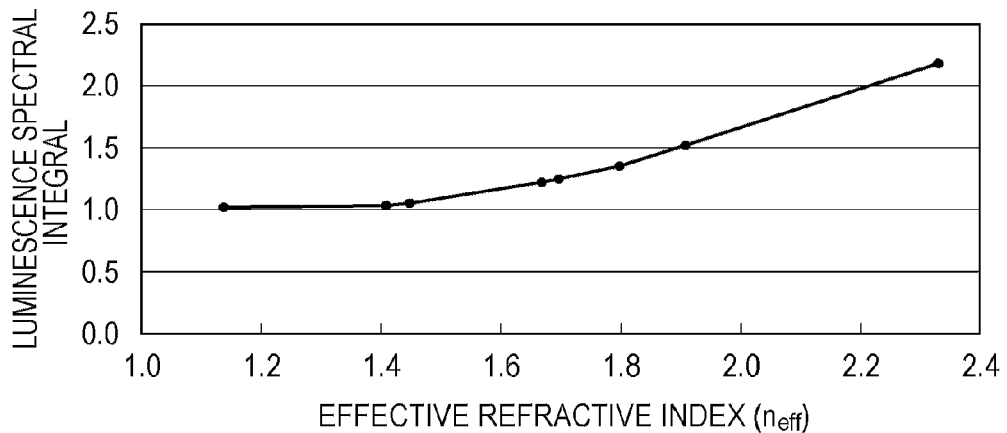
FIG. 7 is a graph showing the effective refractive-index dependence of a green luminescence spectral integral.

In addition, FIG. 7 is a graph showing the effective refractive-index dependence of a green luminescence spectral integral. In the case of air without using the refractive index-control layer, the luminescence spectrum integral was normalized to 1 when the electron transport layer 1 was formed from the above compound (4) (effective refractive index: 1.21). In FIG. 7, the effective refractive index is changed by changing the material for the refractive index-control layer, that is, by changing the refractive index thereof. As shown in FIG. 4, the localized surface plasmon absorption is shifted to a longer wavelength side as the effective refractive index is increased. Hence, the superimposition between the luminescence spectrum and the localized surface plasmon absorption was reduced, the transmittance to the green luminescence was improved, and as shown in FIG. 7, the luminescence spectrum integral was increased with an increase of the effective refractive index.

As a result, it is found that when a green organic EL element is formed which uses a silver thin film as a light extraction-side electrode and which has an improved transmittance, the refractive index of the refractive index-control layer 3 may be adjusted so that the effective refractive index is 1.4 or more.

<Red Organic EL Element>

Next, an organic EL element which emits red light according to aspects of the present invention will be described. The basic structure of the red organic EL element according to aspects of the present invention was similar to that of the above green organic EL element except that a compound (5) was used as a primary component of the luminous layer 6, and a compound (6) was used as a luminous dopant. The concentration of the above compound (6) was 2 percent by weight.

Figure 8:
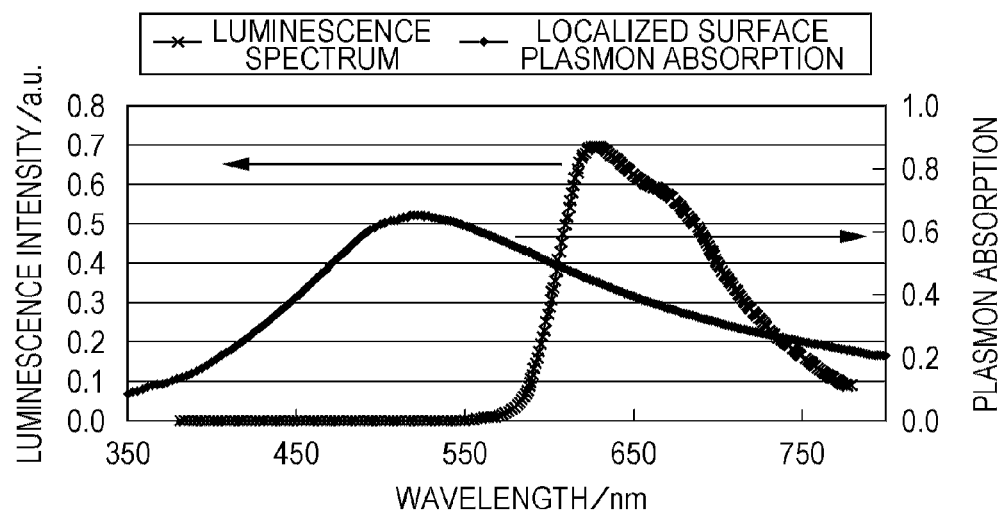
FIG. 8 is a graph showing the localized surface plasmon absorption and the luminescence spectrum from a red organic EL element including no refractive index-control layer.

FIG. 8 is a view showing the luminescence spectrum from a red organic EL element including no refractive index-control layer and the localized surface plasmon absorption. As shown in FIG. 8, when the anode was used as a positive electrode, the silver thin film was used as a negative electrode, and a direct current voltage of 10 V was applied therebetween, red luminescence derived from the above compound (6) which was a luminescent dopant was observed at a maximum luminous wavelength of 630 nm. On the other hand, the peak wavelength of the localized surface plasmon absorption was 522 nm. That is, the obtained luminescence spectrum was superimposed on a skirt of the localized surface plasmon absorption at a longer wavelength side, and although the degree of superimposition was lower than that of the above green organic EL element, the luminescence intensity was reduced by the silver thin film.

Figure 9:
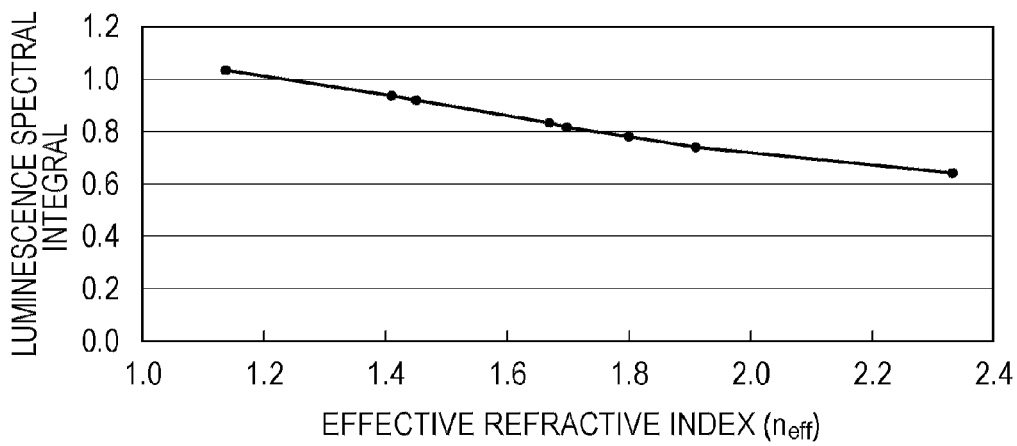
FIG. 9 is a graph showing the effective refractive-index dependence of a red luminescence spectral integral.

In addition, FIG. 9 is a graph showing the effective refractive-index dependence of a red luminescence spectral integral. In the case of air without using the refractive index-control layer, the luminescence spectrum integral was normalized to 1 when the electron transport layer 1 was formed from the above compound (4) (effective refractive index: 1.21). As shown in FIG. 4, the localization surface plasmon absorption is shifted to a longer wavelength side as the effective refractive index is increased. Hence, as opposite to the case of green, the superimposition between the luminescence spectrum and the localized surface plasmon absorption was increased, and the transmittance to the red luminescence was degraded. On the other hand, since the localized surface plasmon absorption was shifted to a shorter wavelength side as the effective refractive index was decreased, the transmittance to the red luminescence was improved, and as shown in FIG. 9, the luminescence spectrum integral was increased.

As a result, it is found that when a red organic EL element is formed which uses a silver thin film as a light extraction-side electrode and which has an improved transmittance, the refractive index of the refractive index-control layer 3 may be adjusted so that the effective refractive index is 2.3 or less.

<Blue Organic EL Element>

Furthermore, an organic EL element which emits blue light according to aspects of the present invention will be described. The basic structure of the blue organic EL element according to aspects of the present invention was similar to that of the above green organic EL element except that a compound (7) was used as a primary component of the luminous layer 6, and a compound (8) was used as a luminous dopant. The concentration of the above compound (8) was 2 percent by weight.

Figure 10:
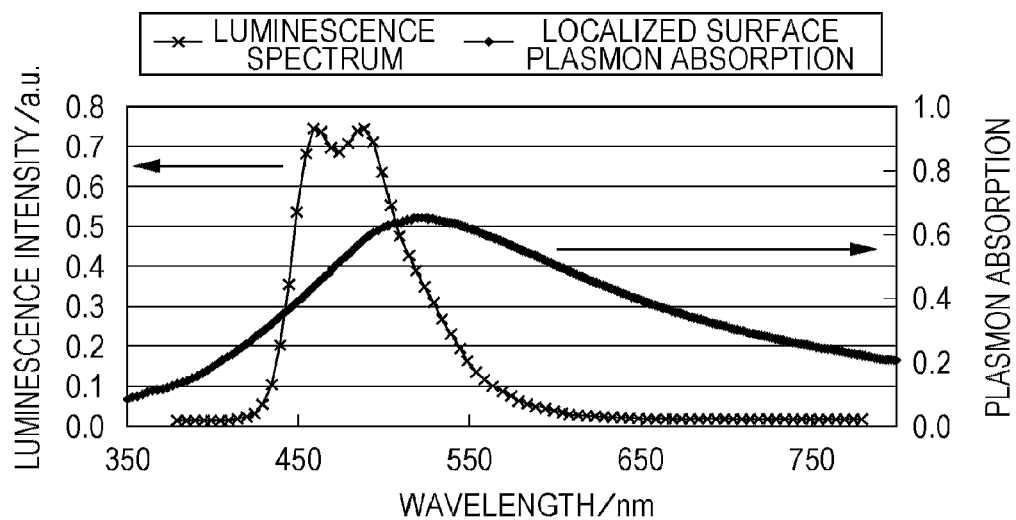
FIG. 10 is a graph showing the localized surface plasmon absorption and the luminescence spectrum from a blue organic EL element including no refractive index-control layer.

FIG. 10 is a view showing the luminescence spectrum from a blue organic EL element including no refractive index-control layer and the localized surface plasmon absorption. As shown in FIG. 10, when the anode was used as a positive electrode, the silver thin film was used as a negative electrode, and a direct current voltage of 10 V was applied therebetween, blue luminescence derived from the above compound (8) which was a luminescent dopant was observed at a maximum luminous wavelength of 490 nm. On the other hand, the peak wavelength of the localized surface plasmon absorption was 522 nm. That is, the obtained luminescence spectrum was superimposed on a skirt of the localized surface plasmon absorption at a shorter wavelength side, and although the degree of superimposition was lower than that of the above green organic EL element, the luminescence intensity was reduced by the silver thin film.

Figure 11:
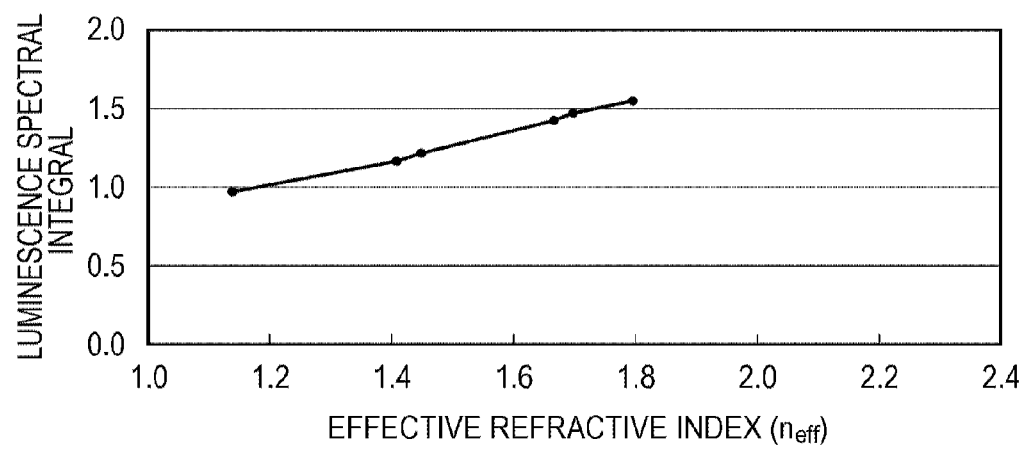
FIG. 11 is a graph showing the effective refractive-index dependence of a blue luminescence spectral integral.

In addition, FIG. 11 is a graph showing the effective refractive-index dependence of a blue luminescence spectral integral. In the case of air without using the refractive index-control layer, the luminescence spectrum integral was normalized to 1 when the electron transport layer 1 was formed of the above compound (4) (effective refractive index: 1.21). As shown in FIG. 4, the localization surface plasmon absorption is shifted to a longer wavelength side as the effective refractive index is increased. Hence, the superimposition between the luminescence spectrum and the localized surface plasmon absorption was reduced, the transmittance to the blue luminescence was improved, and as shown in FIG. 11, the luminescence spectrum integral was increased with an increase of the effective refractive index.

As a result, it is found that when a blue organic EL element is formed which uses a silver thin film as a light extraction-side electrode and which has an improved transmittance, the refractive index of the refractive index-control layer 3 may be adjusted so that the effective refractive index is 1.4 or more.

[Display Apparatus]

Next, with reference to FIGS. 12 and 13, a display apparatus according to aspects of the present invention in which red, green, and blue organic EL elements (RGB three-color EL elements) are arranged will be described. In addition, the structures of the arranged red, green, and blue organic EL elements and compounds used therefor are respectively similar to those of the organic EL elements described above.

Figure 12:
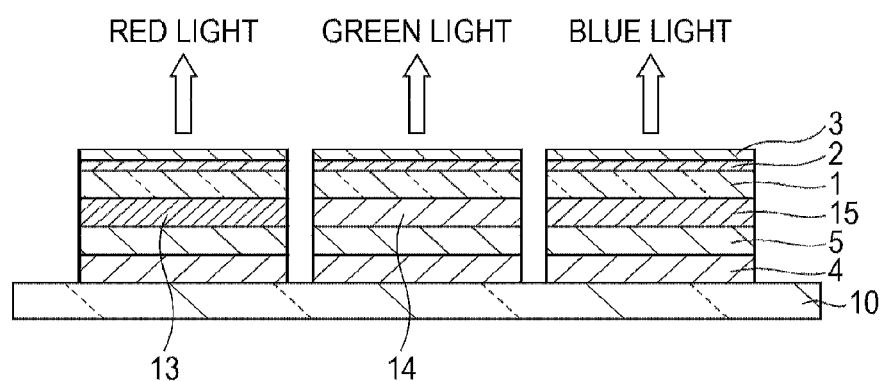
FIG. 12 is a schematic cross-sectional view showing the structure of a display apparatus according to aspects of the present invention.

FIG. 12 is a schematic cross-sectional view showing the structure of the display apparatus according to aspects of the present invention.

As shown in FIG. 12, the anode 4 and the hole injection layer 5 are laminated on a substrate 10. Next, a red luminous layer 13, a green luminous layer 14, and a blue luminous layer 15, which have different luminescent colors, are separately mask-deposited in each pixel. Finally, the electron transport layer 1, the silver layer 2, and the refractive index-control layer 3 are formed, so that the display apparatus is formed. Although the film formation condition is similar to that for the organic EL element described above, the refractive index-control layer 3 is at least formed so as to be arranged in common with the red organic EL element, the green organic EL element, and the blue organic EL element.

According to the description of the above organic EL element, light to be transmitted is monochromatic green, red, or blue light. Accordingly, when the effective refractive index was monotonically increased or decreased, the localized surface plasmon absorption was monotonically shifted to a longer wavelength or a shorter wavelength side, respectively, and the transmittance of a predetermined wavelength could be improved.

Also in the display apparatus, when the effective refractive index is controlled by the refractive index-control layer 3 and the electron transport layer 1 for each color, the transmittance can be improved. However, in order to realize this improvement, since the effective refractive index is adjusted for each color, the refractive index-control layer must be separately formed for each color in a mask deposition process, and hence a manufacturing cost is increased. Hence, when the refractive index-control layer can be formed in common with red, green, and blue light without being separately formed for each color, the manufacturing const can be decreased as compared to that of the above case. When the refractive index-control layer 3 is formed without being separately formed for each color, the refractive index-control layer 3 must be selected to obtain an effective refractive index which can reduce the superimposition between the localized surface plasmon absorption and the luminescence spectra of all the colors, red, green, and blue.

Figure 13:
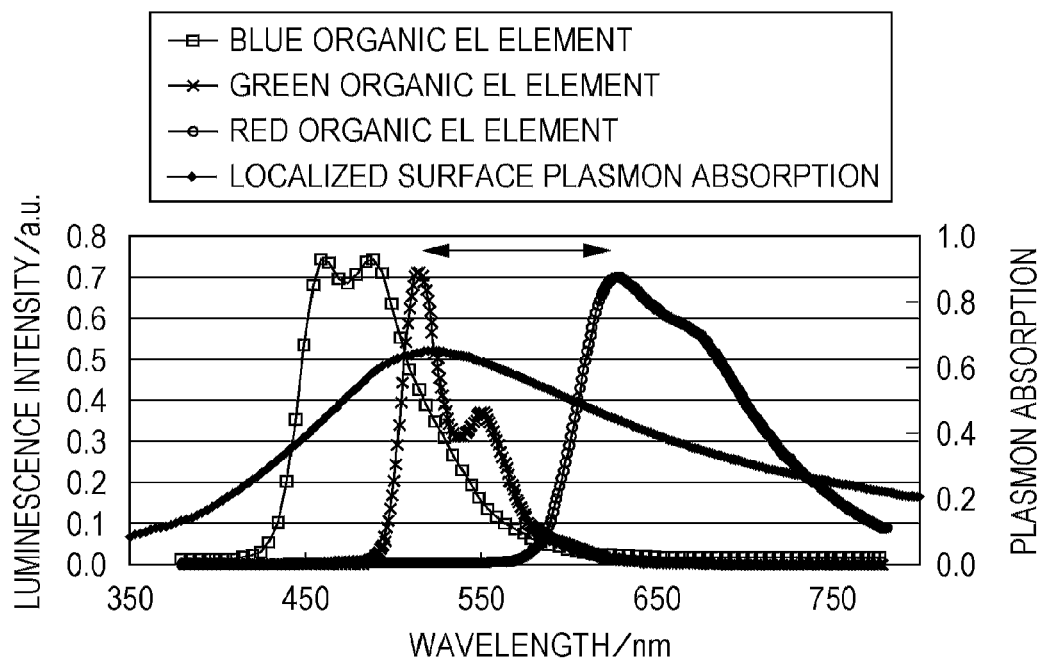
FIG. 13 is a graph showing the localized surface plasmon absorption and the luminescence spectra from a display apparatus including no refractive index-control layer.

FIG. 13 is a view showing the luminescence spectrum from a display apparatus including no refractive index-control layer and the localized surface plasmon absorption. As shown in FIG. 13, the localized surface plasmon absorption has a wide absorption over the visible light region, and in particular, the absorption at a peak wavelength of 522 nm is high. Hence, when the peak wavelength is shifted from the spectral peak wavelengths of red luminescence, green luminescence, and blue luminescence, the transmittance of a predetermined wavelength can be improved.

If the peak wavelength of the localized surface plasmon absorption is ideally shifted to a shorter wavelength from a blue luminescence peak wavelength of 490 nm or to a longer wavelength from a red light peak wavelength of 630 nm, the influence of the localized surface plasmon absorption on all the colors can be reduced. However, among materials which can be used for the refractive index-control layer, a material having the lowest refractive index is usually air (refractive index: 1), and the shift to a shorter wavelength side is limited to a certain extent. Furthermore, as for the shift to a longer wavelength side, as in the case described above, the number of materials which have no light absorption in the visible light region and have a high refractive index is not so many, and it is believed that titanium oxide having a refractive index of approximately 2.7 is an upper limit as a practical use. Hence, it is difficult to completely remove the localized surface plasmon absorption from the visible light wavelength region.

Hence, in consideration of all the colors: red, green, and blue, a wavelength at which the transmittance is to be improved must be determined. In the wavelength region shown by the arrow in FIG. 13 from a peak wavelength of 520 nm of the green luminescence spectrum to a peak wavelength of 630 nm of the red luminescence spectrum, there is a concave portion of the luminescence spectrum. That is, when the peak wavelength of the localized surface plasmon absorption is allowed to exist in this wavelength region having a relatively low luminescence intensity, the loss of the luminescence caused by the plasmon absorption can be reduced.

That is, it is found that when a display apparatus including RGB three-color organic EL elements, each of which uses a silver thin film as a light extraction-side electrode and which has an improved transmittance, is formed, the refractive index of the refractive index-control layer 3 may be adjusted so that the effective refractive index is in a range of 1.4 to 2.3.

While the preferred embodiments according to aspects of the present invention have thus been described, such description is merely illustrative of aspects of the present invention, and various modes different from the above embodiments may be carried out without departing the scope of the present invention. For example, although the case in which the light extraction-side electrode is the cathode is described in the above embodiment, the structure opposite thereto may also be used. In this case, the hole injection layer functions as the charge transport layer in contact with the silver layer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-062207 filed Mar. 18, 2010, which is hereby incorporated by reference herein in its entirety.

What is claimed is:

1. A display apparatus comprising:
    pixels each of which includes:
        an organic El element emitting red light;
        an organic El element emitting green light;
        an organic El element emitting blue light, and
        a refractive index-control layer,
    wherein the organic EL elements each include:
        an anode;
        a cathode; and
        an organic compound layer provided therebetween which contains a luminous layer and a charge transport layer, wherein
    one of the anode and the cathode arranged at a light extraction side is a silver layer which contains silver, which has a thickness of less than 30 nm, and which is in contact with the charge transport layer,
    the refractive index-control layer is arranged on the silver layer in common with the organic El element emitting red light, the organic El element emitting green light, and the organic El element emitting blue light, and
    an effective refractive index ($n_{eff}$) represented by the following formula is in a range of 1.4 to 2.3

$$N_{eff}=0.7 \times n_u + 0.3 \times n_d$$

where $n_u$ indicates the refractive index of the refractive index-control layer, and $n_d$ indicates the refractive index of the charge transport layer.

2. The display apparatus according to claim 1, wherein the thickness of the refractive index-control layer is in a range of 10 to 20 nm.

3. The display apparatus according to claim 1, wherein the thickness of the silver layer is in a range of 5 to 20 nm.

* * * * *